United States Patent
Keleher et al.

(10) Patent No.: US 6,194,306 B1
(45) Date of Patent: Feb. 27, 2001

(54) MASK AND METHOD FOR FORMING DYNAMIC RANDOM ACCESS MEMORY (DRAM) CONTACTS

(75) Inventors: Michael P. Keleher, Lockport, NY (US); Jeffrey A. McKee, Grapevine, TX (US); Troy H. Herndon; Jing-Shing Shu, both of Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/219,240

(22) Filed: Dec. 22, 1998

(51) Int. Cl.$^7$ .................................................. H01L 21/4763
(52) U.S. Cl. .......................... 438/622; 438/256; 438/597
(58) Field of Search .................................... 438/239, 256, 438/597, 622, 640, 624, 637, 668

(56) References Cited

U.S. PATENT DOCUMENTS 5,985,746 * 11/1999 Kapoor .................................. 438/622
6,124,198 * 9/2000 Moslehi ................................ 438/622

* cited by examiner

Primary Examiner—David Nelms
Assistant Examiner—Phuc T. Dang
(74) Attorney, Agent, or Firm—Wade James Brady, III; Frederick J. Telecky, Jr.

(57) ABSTRACT

A mask (10) includes a pattern (14) having a plurality of substantially rectangular shapes (20) arranged longitudinally in each of a plurality of substantially parallel rows (22). The rows (22) are evenly spaced apart from each other. The substantially rectangular shapes (20) in each row (22) are evenly spaced apart from each other and offset from the substantially rectangular shapes (20) in neighboring rows (22). The substantially rectangular shapes (20) define a plurality of T-shapes (24) connected to and offset from each other.

10 Claims, 4 Drawing Sheets

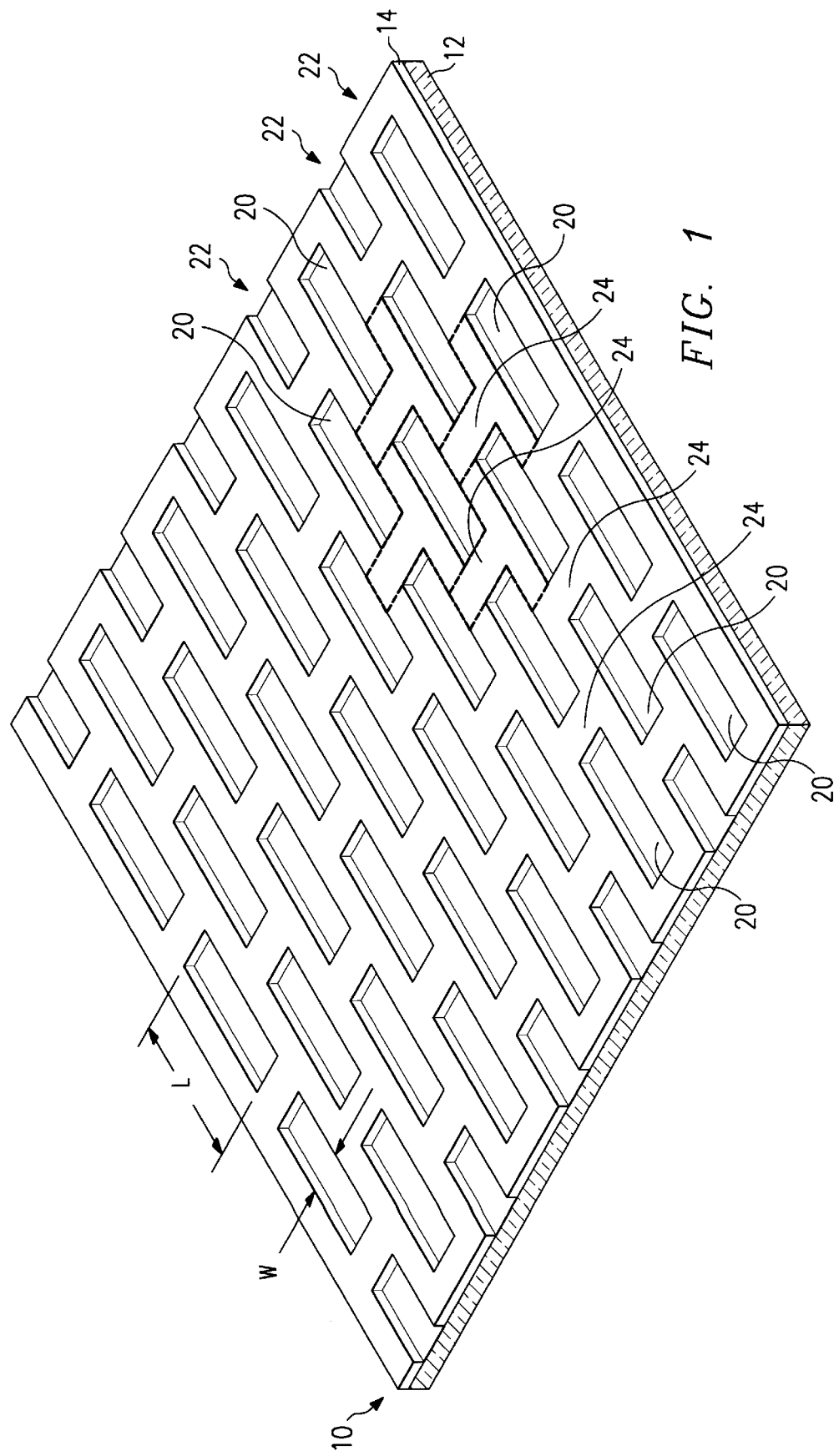

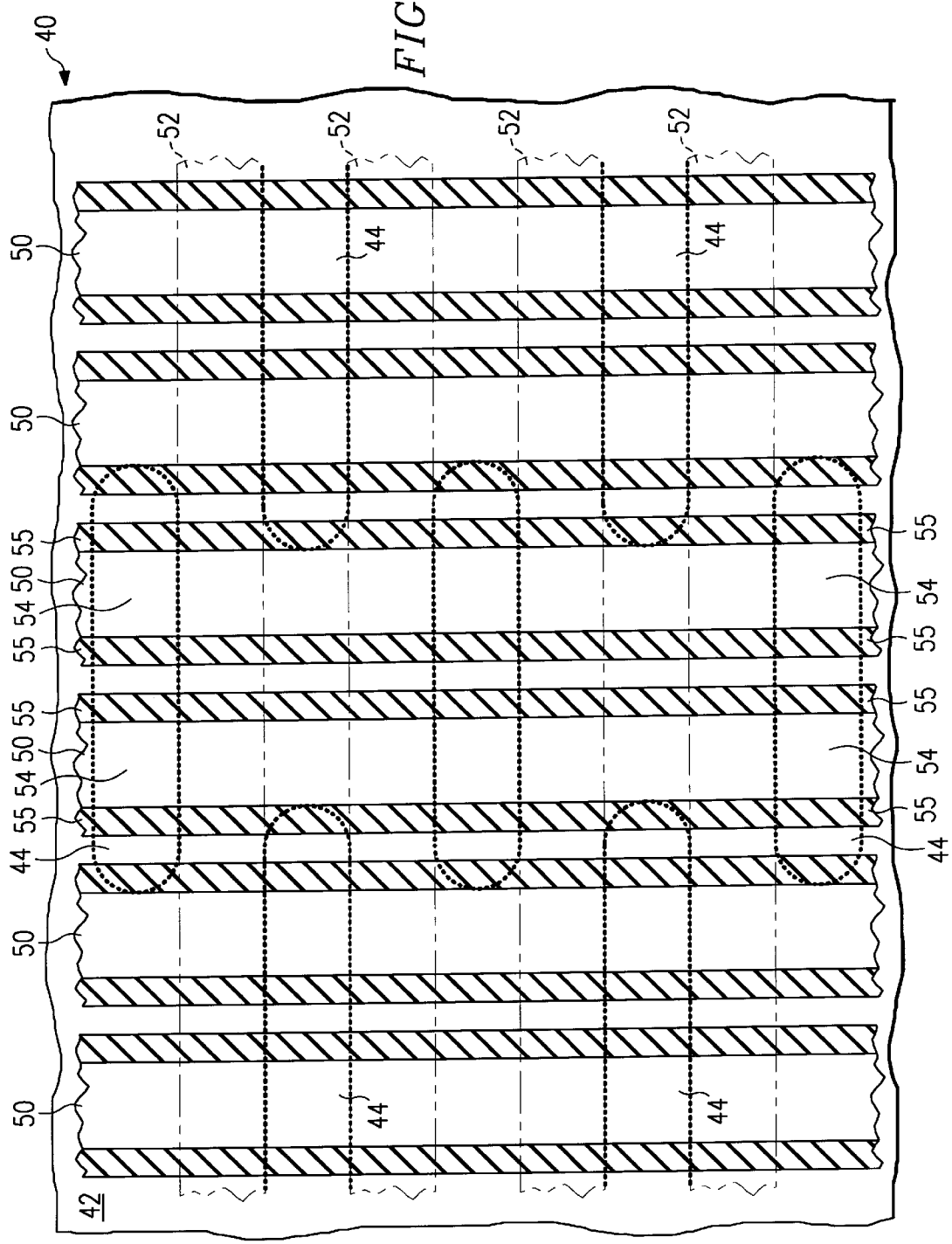

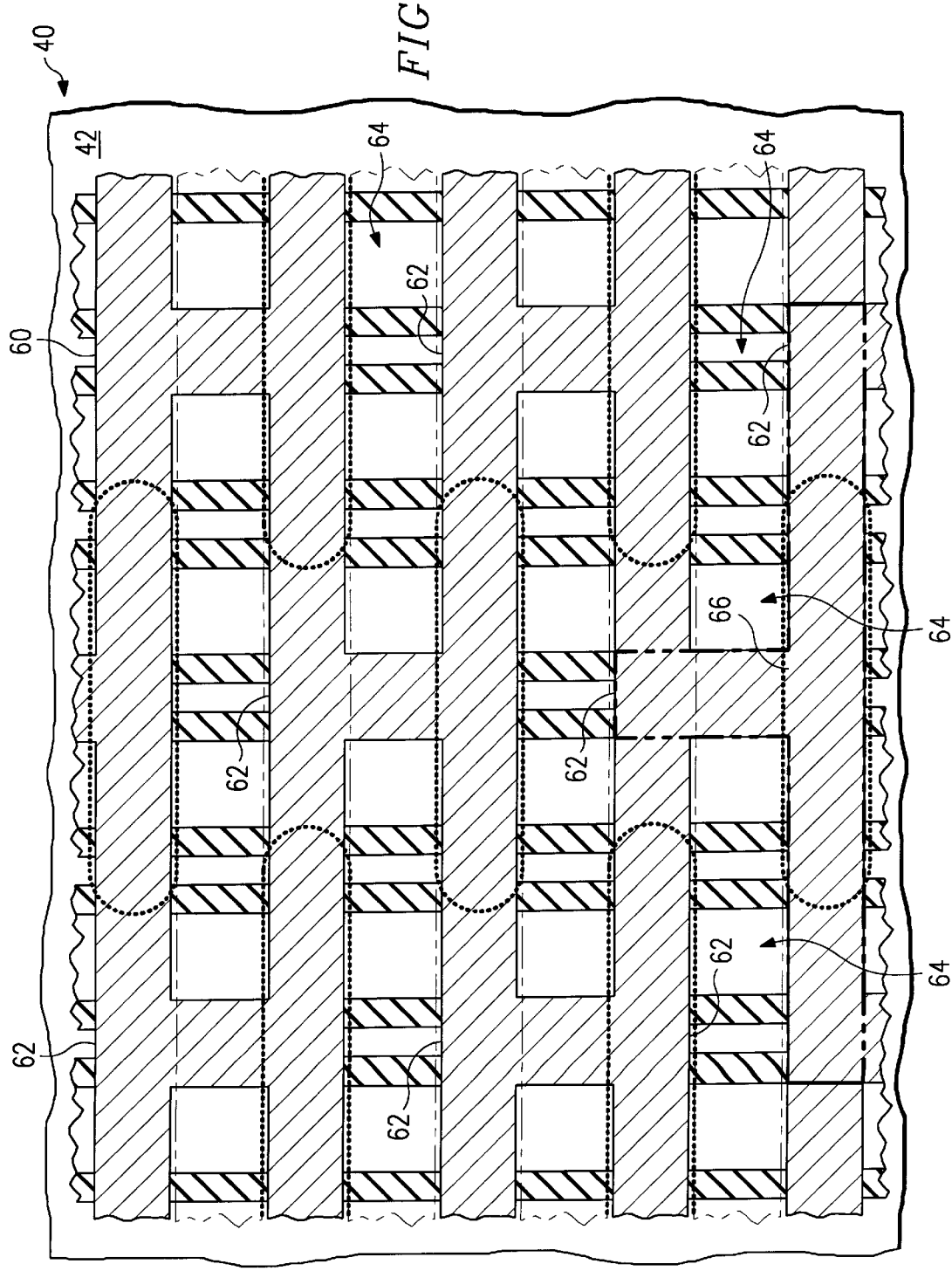

MASK AND METHOD FOR FORMING DYNAMIC RANDOM ACCESS MEMORY (DRAM) CONTACTS

TECHNICAL FIELD OF THE INVENTION

This invention relates generally to electronic devices, and more particularly to a mask and method for forming dynamic random access memory (DRAM) contacts.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors and other semiconductor devices. Typically, such devices are fabricated on a substrate and interconnected to form memory arrays, logic structures, timers and other components of an integrated circuit. One type of memory array is a dynamic random access memory (DRAM) in which memory cells can retain information only temporarily and must be refreshed at periodic intervals. Despite this limitation, DRAMs are widely used because they provide low cost per bit, high device density and feasibility of use.

In a DRAM, each memory cell typically includes an access transistor coupled to a storage capacitor. The memory cells are accessed by a series of word and bit lines connected to the access transistor. The word lines control the access transistors to allow the bit lines to read data into and out of the storage capacitors.

To reduce the cost of manufacturing DRAMs, multiple contact patterns have been used to form bit line contacts between a bit line and an access transistor and storage node contacts between an access transistor and a storage capacitor. Thus, separate masking processes are not needed for the bit line and storage node contacts. Multiple contact patterns, however, are typically complex due to the density and configuration of the DRAM cells. This complexity leads to difficulty in manufacturing and inspecting the patterns.

SUMMARY OF THE INVENTION

In accordance with the present invention, a mask and method for forming multiple contact patterns are provided that substantially eliminate or reduce disadvantages and problems associated with previously developed systems and methods. In particular, the present invention provides a mask and method that uses a simplified pattern to define multiple contact in a dynamic random access memory (DRAM).

In one embodiment of the present invention, a mask includes a pattern having a plurality of substantially rectangular shapes arranged longitudinally in each of a plurality of substantially parallel rows. The rows are evenly spaced apart from each other. The substantially rectangular shapes in each row are evenly spaced apart from each other and offset from substantially rectangular shapes in neighboring rows. The substantially rectangular shapes define a plurality of T-shapes connected to and offset from each other.

Technical advantages of the present invention include providing an improved mask and method for forming multiple contacts in an integrated circuit. In particular, the mask has a simplified pattern formed of a plurality of substantially rectangular shapes arranged in a plurality of rows. The substantially rectangular shapes define a plurality of T-shapes that each represent a plurality of individual contacts. The simplified pattern is not phase critical and is scalable to different geometries. Thus, complex masking features that are difficult to photo lithographically reproduce and inspect on an integrated circuit are avoided. Accordingly, manufacturing costs of the integrated circuit are reduced.

Another technical advantage of the present invention includes providing an improved mask and method for forming DRAM contacts. In particular, the mask is used to define a plurality of substantially rectangular sections to be etched from a conductive layer overlying a DRAM. Etching of the substantially rectangular sections leaves a plurality of T-shaped sections in the conductive layer that each embody a bit line contact and two storage node contacts of the DRAM. As a result, manufacturing costs of the DRAM are reduced.

Other technical advantages will be readily apparent to one skilled in the art from the following figures, description and claims.

BRIEF DESCRIPTION OF THE DRAWINGS

For a more complete understanding of the present invention and its advantages thereof, reference is now made to the following description taken in conjunction with the accompanying drawings in which:

FIG. 1 is perspective view of a mask illustrating a multiple contact pattern in accordance with the present invention; and FIG. 2A–C are a series of schematic top-plan views illustrating fabrication of contacts for an integrated circuit substrate in accordance with the present invention.

DETAILED DESCRIPTION OF THE INVENTION

Figure 2C:
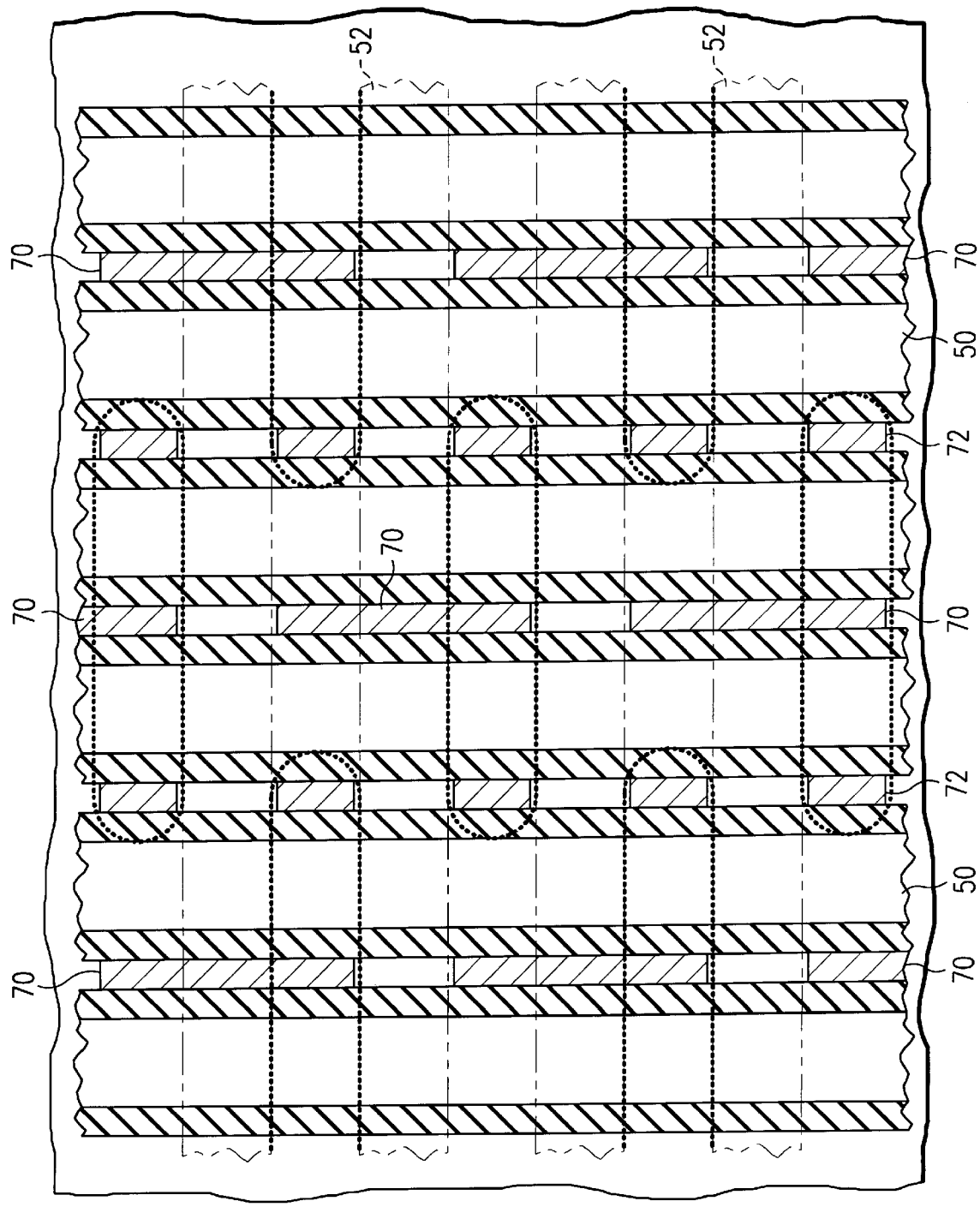

FIG. 1 illustrates a mask 10 in accordance with the present invention. As described in more detail below, the mask 10 is used in connection with a radiation source such as ultraviolet light to expose selected portions of a resist layer on an integrated circuit substrate. The resist layer is developed to produce an etch mask corresponding to the mask. Using the etch mask, a conductive layer is etched to form multiple contact structures on the integrated circuit substrate.

Referring to FIG. 1, the mask 10 is conventionally constructed of a substrate 12 and a multiple contact pattern 14. The substrate 12 is formed of a transparent material that transmits a wavelength of radiation used in connection with the mask 10 to pattern resist material on the integrated circuit substrate. For visible and ultraviolet wavelengths, the substrate 12 may be formed of quartz, silica or any other material that has high optical transmission of the visible or ultraviolet wavelength.

The multiple contact pattern 14 is formed of an opaque material that absorbs or reflects the wavelength of radiation used in connection with the mask 10 to pattern resist material on the integrated circuit substrate. Thus, the opaque material prevents exposure of corresponding areas of the resist material on the integrated circuit substrate. For visible and ultraviolet wavelengths, the opaque material is typically chrome due to its absorption of visible and ultraviolet wavelengths as well as its compatibility with quartz and conventional mask fabrication techniques. It will be understood that the mask 10 may be constructed of other suitable structures or materials without departing from the scope of the present invention.

The multiple contact pattern 14 comprises a plurality of rectangular shapes 20. The rectangular shapes 20 are each substantially identical to each other, having substantially equal lengths (L) and widths (W). The rectangular shapes 20 are arranged longitudinally in a plurality of rows 22. The rows 22 are substantially parallel to and evenly spaced apart from each other. The rows 22 may each be spaced apart a distance substantially equal to the width (W) of the rectangular shapes 20.

In each row 22, the rectangular shapes 20 are evenly spaced apart from each other and offset from the rectangular shapes 20 in neighboring rows 22. The rectangular shapes 20 are offset such that the middle of a rectangular shape 20 is aligned with a middle of the space between a pair of the rectangular shapes 20 in a neighboring row 22.

The parallel and offset rectangular shapes 20 define a plurality of T-shapes 24 connected to and offset from each other. The T-shapes 24 are substantially identical to each other, having a base 26 and a substantially perpendicular projection 28. It will be understood that the rectangular shapes 20 may be otherwise sized and positioned with respect to each other as long as the rectangular shapes 20 define connected and offset T-shapes 24. Thus, the size of the rectangular shapes 20 may be varied in the multiple contact pattern 12 to vary the size of the T-shapes 24.

The configuration of the rectangular shapes 20 may also be varied as long as the shapes 20 define the connected and offset T-shapes 24. Thus, the shapes 20 may be substantially rectangular shapes with a length (L) much greater than a width (W). For example, the substantially rectangular shapes may have curved or multisided ends and the like.

For the embodiment of FIG. 1, the opaque material of the multiple contact pattern 14 is within the T-shapes 24 and absent from the rectangular shapes 20. Thus, resist material corresponding to the rectangular shapes 20 will be exposed by the mask 10. It will be understood that the mask 10 may also be inversely configured to define the multiple contact pattern 14. In this embodiment, the opaque material is within the rectangular shapes 20 and absent from the T-shapes 24. Thus, resist material corresponding to the T-shapes 24 will be exposed by the mask.

As described in more detail below, the mask 10 may be used to form multiple contact structures for a dynamic random access memory (DRAM). In the DRAM embodiment, the width (W) of the rectangular shapes 20 corresponds to bit line width while the length (L) corresponds to the distance between bit line contacts. The spacing between the rows 22 corresponds to bit line spacing. In each row 22, the spacing between the rectangular shapes 20 corresponds to word line spacing. Thus, in this embodiment, the particular dimensions and spacing of the rectangular shapes 20 and T-shapes 24 depends on the DRAM and the power by which the multiple contact pattern 14 is reduced down to the DRAM.

FIGS. 2A–C are a series of schematic top-plan views illustrating fabrication of contacts for an integrated circuit substrate using the mask 10 in accordance with the present invention. Referring to FIG. 2A, the integrated circuit substrate is a partially formed DRAM 40. The DRAM 40 comprises an underlying semiconductor layer 42 with a plurality of moats 44 that each form part of a pair of DRAM cells. The moats 44 are suitably doped regions of the semiconductor layer 42. When completed, each DRAM cell is formed of an access transistor and a storage capacitor. The access transistors are each formed by a section of a wordline 50 over the moat 44. The word lines 50 control the access transistors to allow later formed bit lines 52 (shown in phantom) to read data into and out of the storage capacitors.

The word lines 50 protrude from the underlying semiconductor layer 42 and include a gate structure 54, a gate insulator between the gate structure 54 and the moat 44 and a sidewall insulator 55 outwardly of the gate structure 54. The gate structure 54 is operatively associated with source and drain regions in the moat 44 to form the access transistor for each DRAM cell. The access transistors formed by the word lines 50 may be conventional field-effect transistors (FET) or any other type of suitable device capable of controlling bit line 52 access to the storage capacitors.

Bit line contact points (BLC) 54 and storage node contact points (SNC) 56 are disposed between the word lines 50. As described in more detail below, bit line contacts are formed over the bit line contact points to connect the bit lines 52 to the access transistors. Storage node contacts are formed over the storage node contact points to connect the storage capacitors to the access transistors. It will be understood that the DRAM 40 may be otherwise suitably configured without departing from the scope of the present invention.

Referring to FIG. 2B, a conductive layer 60 is formed, patterned and etched outwardly of the DRAM 40 to form multiple contact structures 62 corresponding to the multiple contact pattern 14 of the mask 10. The conductive layer 60 may be formed of a conventionally deposited and doped polysilicon material or any other suitable conductor. The conductive layer 60 is deposited on the underlying semiconductor layer 42 to a depth above the word lines 50.

The conductive layer 60 is patterned with the mask 10 using standard lithographic techniques. In a particular embodiment, the conductive layer 60 is patterned by depositing a layer of positive resist on the conductive layer 60, projecting to the multiple contact pattern 14 of the mask 10 onto the resist layer using conventional exposure tools such as optical, e-beam and x-ray radiation and developing the resist using an appropriate solvent to remove exposed portions of the resist. The developed resist forms an etch mask corresponding to the T-shapes 24 of the multiple contact pattern 14. It will be understood that the conductive layer 60 may be otherwise patterned by suitable lithographic techniques. For example, if the mask is inversely configured with the opaque material within the rectangular shapes 20 and absent from the T-shapes 24, a negative resist is used. In this embodiment, the resist is developed using a solvent that removes unexposed portions of the resist. Thus, the etch mask in this embodiment also corresponds to the T-shapes 24 of the multiple contact pattern 14.

The patterned conductive layer 60 is etched through the resist etch mask with a conventional anisotropic etch. The anisotropic etch removes exposed rectangular sections 64 of the conductive layer 60 to form voids corresponding to the rectangular shapes 20 of the mask 10. The protected T-shaped sections 66 of the conductive layer 60 form the multiple contact structures 62 corresponding to the T-shapes 24 of the mask 10. After the etch, the resist etch mask is conventionally stripped from the multiple contact structures 62. It will be understood that the conductive layer 60 may be otherwise patterned and etched by suitable lithographic techniques.

Referring to FIG. 2C, the multiple contact structures 62 are planarized down to the level of the word lines 50 to leave a bit line contact 70 and storage node contact 72 between the word lines 50. Each bit line contact 70 is disposed over a bit line contact point and provides a contact for two DRAM cells to a bit line 52. Each storage node contact 72 is disposed over a storage node contact point and connects the access transistor of a DRAM cell to the storage capacitor. Thus, the DRAM contacts are formed using a simplified mask that is easily reproduced and inspected. Accordingly, manufacturing costs of the DRAM are reduced. In addition, the simplified pattern of the mask is scalable to different geometries.

The multiple contact structure 62 may be planarized with the conventional chemical-mechanical polish (CMP) or other suitable means capable of removing a top portion of the multiple contact structure 62 above the word lines 50. After the contacts 70 and 72 have been formed, the bit lines 52 may be conventionally formed for the DRAM 40. The bit lines 52 extend across the bit line contact 70 and between the storage node contact 72. The remaining components of the DRAM 40 may be conventionally formed using conventional integrated circuit processing techniques.

Although the invention has been described with several embodiments, various changes and modifications may be suggested to one skilled in the art. It is intended that the present invention encompass such changes and modifications as fall within the scope of the appended claims.

What is claimed is:

1. A method of forming contacts for a memory device, comprising the steps of:

providing a mask having a pattern comprising:
   a plurality of substantially rectangular shapes arranged longitudinally in each of a plurality of substantially parallel rows;
   the substantially rectangular shapes in each row offset from the substantially rectangular shapes of neighboring rows;
   the substantially rectangular shapes defining a plurality of T-shapes connected to and offset from each other;

providing a substrate comprising:
   a plurality of word line structures protruding from a surface of an underlying layer;
   a conductive layer disposed outwardly of the word line structures and the surface of the underlying layer;

using the mask to define a plurality of substantially rectangular sections in the conductive layer to be etched, the substantially rectangular sections corresponding to the substantially rectangular shapes of the pattern;

etching the substantially rectangular sections to leave a plurality of T-shaped sections in the conductive layer, the T-shaped sections corresponding to the T-shapes of the pattern; and removing an upper portion of conductive layer disposed outwardly of the word line structures to form a plurality of individual contacts from a lower portion of each T-shape section.

2. The method of claim 1, the wherein the rows of the mask are evenly spaced apart from each other.

3. The method of claim 1, wherein the substantially rectangular shapes in each row are evenly spaced apart from each other.

4. The method of claim 1, wherein the substantially rectangular shapes are substantially identical to each other.

5. The method of claim 1, wherein the T-shapes are substantially identical to each other.

6. The method of claim 1, the step of removing an upper portion of the conductive layer comprising planarizing the conductive layer down to a level equal to or below a top of the word line structures.

7. The method of claim 1, wherein at least three individual contacts are formed from each T-shape section.

8. The method of claim 1, wherein the individual contacts comprise a bit line contact and two storage node contacts of a DRAM memory device.

9. A DRAM contact fabricated using the method of claim 1.

10. A DRAM device fabricated using the method of claim 1.

* * * * *